United States Patent [19]

Schreiber et al.

[11] Patent Number: 5,176,780
[45] Date of Patent: Jan. 5, 1993

[54] METHOD OF BONDING POLYIMIDE FILMS AND PRINTED CIRCUIT BOARDS INCORPORATING THE SAME

[75] Inventors: Herbert Schreiber, Wollerau; Wolfgang Saur, Buttikon, both of Switzerland

[73] Assignee: Gurit-Essex AG, Freienbach, Switzerland

[21] Appl. No.: 703,194

[22] Filed: May 20, 1991

[30] Foreign Application Priority Data

May 23, 1990 [DE] Fed. Rep. of Germany ....... 4016548

[51] Int. Cl.$^5$ .............................................. C09J 5/02
[52] U.S. Cl. ............................... 156/307.3; 156/331.5; 174/259; 428/473.5; 525/490; 528/163
[58] Field of Search ........................... 156/331.5, 307.3; 174/259; 528/163; 525/490; 428/473.5

[56] References Cited

U.S. PATENT DOCUMENTS

| | | | |
|---|---|---|---|
| 4,278,733 | 7/1981 | Benzinger | 525/490 |
| 5,021,484 | 6/1991 | Schreiber et al. | |
| 5,044,074 | 9/1991 | Hadwiger et al. | 428/473.5 |

FOREIGN PATENT DOCUMENTS 0356379  2/1990  European Pat. Off. .

Primary Examiner—John J. Gallagher
Attorney, Agent, or Firm—Tarolli, Sundheim & Covell

[57] ABSTRACT

An adhesive having a content of a thermically curable oxazene resin which contains at least one 1-oxa-3-aza tetraline group in the molecule, optionally in combination with at least one curable epoxy compound, is used for bonding polyimide films to films of the same kind or to other substrates, particularly metal foils. Such bondings are highly heat-resistant and have an excellent peeling resistance. Therefore, they are suitable for the manufacture of printed circuit boards having high thermal stability and peeling resistance.

35 Claims, No Drawings

METHOD OF BONDING POLYIMIDE FILMS AND PRINTED CIRCUIT BOARDS INCORPORATING THE SAME

FIELD OF THE INVENTION

This invention refers to a method for bonding a polyimide film, and to printed circuit boards.

BACKGROUND OF THE INVENTION

As is well known, polyimides are plastics which contain in their main chain the grouping

—CO—NR—CO— as a linear unit, or the grouping $$-R-N\begin{matrix}CO-\\ \\CO-\end{matrix}$$

as a heterocyclic unit. They are condensation products of polyfunctional carboxylic acid anhydrides and primary diamines.

Typical examples of such polyimides are the polypyromellitimides, commercially available under the trade name "Kapton" (registered Trade Mark of DuPont), which can be prepared by reacting pyromellitic dianhydride with aromatic diamines, such as m-phenylene diamine or bis(4-aminophenyl) ether.

They have outstanding thermic properties. Thus, films prepared from them are ideal materials for the preparation of flexible printed circuit boards.

As an example, a commercial polyimide film of "Kapton H" shows the following typical properties:

| Density | 1.4 g/cm$^3$ |
| --- | --- |
| Thickness | 0.0075 ... 0.125 mm |
| Breaking-down voltage | 140 ... 270 kV/mm |
| Tensile strength, lengthwise | 170 N/mm$^2$ |
| Tensile strength, crosswise | 170 N/mm$^2$ |
| Limiting temperature | >180° C. |

However, it was disadvantageous that so far the adhesives which were available for a bonding to metals, particularly to copper, were not heat-resistant enough, and did result in a to poor peeling resistance of the bonding.

SUMMARY OF THE INVENTION

An object of the present invention is to eliminate the disadvantages of the prior art described above, and to provide a method for producing highly heat-resistant bondings of polyimide films.

Another object of the invention is to provide such bondings having an excellent peeling resistance.

Still another object of the invention is to provide printed circuit boards combining the two abovementioned objects.

In order to accomplish these objects, the present invention uses a thermically curable oxazene resin which contains at least one 1-oxa-3-aza tetraline group in the molecule, optionally in combination with at least one curable epoxy compound, as the adhesive.

Said thermically curable oxazene resin, as well as their prepolymers, are hereafter jointly called "oxazene resins".

PREFERRED EMBODIMENTS OF THE INVENTION

The method according to the invention is suitable for bonding polyimide films both to films of the same kind, and to other substrates, particularly to metals in the form of sheet metal or in that of copper, aluminium, nickel or resistance foils.

As is well known, oxazene resins are 1-oxa-3-aza tetraline group containing compounds or their prepolymers. They are known, e.g., from the publications CH-A5-574,978, 579,113 and 606,169, as well as EP-A1-0,356,379.

Oxazene resins which are suitable for the purposes of the present invention and their preparation are described in the abovementioned publication EP-A1-0,356,379.

Suitable epoxy resins are in particular monofunctional or multifunctional epoxy compounds which can be cured thermically, catalyticly or by means of a curing agent. Suitable epoxy compounds are, e.g., described in:

Sidney H. Goodman, Handbook of Thermoset Plastics, Noyes Publications, Park Ridge, N.J.;
W. G. Potter, Epoxide Resins, Ilife Books, London;
Henry Lee and Kris Neville, Handbook of Epoxy Resins, McGraw-Hill Book Company, New York/San Francisco/Toronto/London.

Particularly suitable are cycloaliphatic epoxy compounds described in the abovementioned publication EP-A1-0,356,379.

The preferred epoxy compounds are those of the group consisting of:

2-(3,4-epoxy)cyclohexyl-5,5-spiro(3,4-epoxy)-cyclohexane m-dioxane;
onefold to fourfold methylated 2-(3,4-epoxy)cyclohexyl-5,5-spiro-(3,4-epoxy)-cyclohexane m-dioxane;
4-(1,2-epoxyethyl) 1,2-epoxycyclohexane;
1,2:8,9-diepoxy p-menthane;
2,2-bis(3,4-epoxycyclohexyl) propane;
bis(2,3-epoxycyclopentyl) ether;
1,2:5,6-diepoxy-4,7-hexahydromethano indane;
bis(3,4-epoxycyclohexylmethyl) adipate;
bis(3,4-epoxy-6-methyl-cyclohexylmethyl) adipate;
bis(3,4-epoxycyclohexylmethyl) terephthalate;
bis(3,4-epoxy-6-methyl-cyclohexylmethyl) terephthalate;
3,4-epoxy-cyclohexane carboxylic acid-(3,4-epoxycyclohexylmethyl) ester;
3,4-epoxy-6-methyl-cyclohexane carboxylic acid-(3,4-epoxy-6-methyl-cyclohexylmethyl) ester;
1,2-bis(5(1,2-epoxy)-4,7-hexahydromethanoindanoxy) ethane;
1,1,1-tris((5-(1,2-epoxy)-4,7-hexahydromethanoindanoxy)methyl) propane: and
4,5-epoxy-hexahydrophthalic acid bis-(3,4-epoxycyclohexylmethyl).

The most preferred compounds are those of the group consisting of:

2-(3,4-epoxy)cyclohexyl-5,5-spiro(3,4-epoxy)-cyclohexane m-dioxane;
onefold to fourfold methylated 2-(3,4-epoxy)cyclohexyl-5,5-spiro-(3,4-epoxy)-cyclohexane m-dioxane;
bis(3,4-epoxycyclohexylmethyl) adipate;
bis(3,4-epoxy-6-methyl-cyclohexylmethyl) adipate;

3,4-epoxy-cyclohexane carboxylic acid-(3,4-epoxycyclohexylmethyl) ester; and 3,4-epoxy-6-methyl-cyclohexane carboxylic acid-(3,4-epoxy-6-methyl-cyclohexylmethyl) ester.

By means of the present invention, bondings of polyimide films to copper foils having peeling resistance up to more than 1.7 N/mm can be produced. Thereby the failure is due to the rupture of the polyimide film. The rupture strength of the polyimide film bonded to a copper foil, after corroding the copper, is still up to over 85% of its initial value. The glass transition temperature $T_g$ (also called "glass temperature") of the bonding is about 250° C.

EXAMPLES

1. Starting materials

The following starting materials are used in the following examples:

1.1 Copper foils

| (Cu/1) | Copper foil 1 | |
|---|---|---|
| | Type "Beige", etched - Manufacturer: | Gould |
| | Thickness: | 0.035 mm |
| | Basis weight: | 288 g/m² |
| (Cu/2) | Copper foil 2 | |
| | Type "CTF R8", etched - Manufacturer: | Fukuda |
| | Thickness: | 0.035 mm |
| | Basis weight: | 288 g/m² |

1.2 Polyimide films

| (PI/1) | Polyimide film 1 Type "100 HN" Thickness: | 0.02 mm |
|---|---|---|
| (PI/2) | Polyimide film 2 Type "Kapton" Thickness: | 0.02 mm |

2. Adhesive

A mixture of the oxazene resin and the epoxy resin in the weight ratios given hereafter under 2.3 was used as the adhesive.

2.1 Oxazene resins
(Ox/1) Oxazene resin 1
The reaction product of 4,4'-diamino-diphenyl methane with phenol and formaldehyde in molar ratio of 1:2:4 having the structural formula:

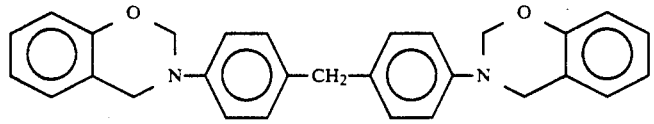

(Ox/2) Oxazene resin 2
The reaction product of 1 mole (2 equivalents) of the novolak obtained by reacting 2 moles of phenol and 1 mole of formaldehyde with 2 moles of aniline and 4 moles of formaldehyde, having the following average composition:

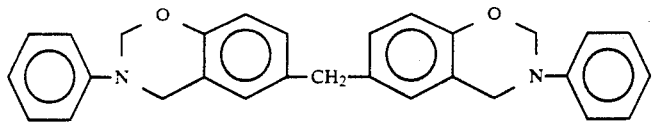

2.2 Epoxy compounds
(Ep/1) Epoxy compound 1
3,4-Epoxycyclohexylmethyl-3,4-epoxycyclohexane carboxylate (Trade Name "Araldit CY 179")
(Ep/2) Epoxy compound 2
2-(3,4-Epoxy)cyclohexyl-5,5-spiro(3,4-epoxy)cyclohexane m-dioxane (Trade Name "Araldit CY 175")
2.3 Composition of adhesive

| Adhesive | Ox/1 | Ox/2 | Ep/1 | Ep/2 | (Parts by weight) |
|---|---|---|---|---|---|
| Kl/1 | 67 | | 33 | | |
| Kl/2 | 60 | | | 40 | |
| Kl/3 | | 60 | | 40 | |
| Kl/4 | | 65 | 35 | | |
| Kl/5 | 30 | 30 | | 40 | |

3. Preparation of samples

Strips of a copper foil were wiped with methylethylketone and put onto a glass plate. Then, a solution of the adhesive in methylethylketone having an adhesive content of 50% by weight was poured over the strips. Thereafter, the strips were dried for about 15 minutes and then heated in a forced-air oven for 10 minutes to 100° C.

Meanwhile, a heating plate had been heated to about 120° C. and covered with an aluminium foil. Then, the heated strips were put onto the heating plate. The polyimide film was drawn up onto the strips, the convex side facing the copper foil, by means of a roller. Finally, the bonding was cured in a press at 200° C. for 1 hour.

4. Determination of peeling adhesion

In all bondings the peeling resistance is higher than the rupture strength of the polyimide film.

For tests on a Zwick tensile testing machine, samples having a unbonded starting section were prepared. The width of the strips was 6 mm; the pull-off speed was 100 mm/min; and the pull-off direction was 180°.

Values up to 1,7 N/mm were determined, whereby in all cases the polyimide film broke before any peeling happened.

5. Rupture strength

For testing whether the rupture strength of the polyimide film is lowered by the bonding, the following samples were prepared using the adhesive Kl/1:

| Sample No. | Copper foil | Polyimide film | Adhesive | Rupture strength N/mm | Remarks |
|---|---|---|---|---|---|
| 1 | Cu/1 | PI/2 | KI/1 | 3.8/3.8 | 1) |
| 2 | Cu/2 | PI/2 | KI/1 | 3.8/3.9 | 1) |
| 3 | Cu/1 | PI/1 | KI/1 | 4.5/3.5 | 1) |
| 4 | Cu/2 | PI/1 | KI/1 | 3.9/4.3 | 1) |
| 5 | 2) | PI/1 | | 5.5 | 3) |
| 6 | 2) | PI/2 | | 5.7 | 3) |
| 7 | Cu/2 | PI/1 | | >12.3 | 3) |
| 8 | Cu/2 | 2) | | 11.8 | 3) |

Remarks:
1) corroded by means of Ultra-Etch 9151
2) not bonded
3) not corroded

Thus, the rupture strength of the corroded polyimide film is not essentially lowered by the bonding. Said rupture strengths of the corroded polyimide films are essentially higher than the rupture strengths determined in the peeling tests.

6. Thermal stability

Sample 4, after-cured for 4 hours at 220° C., not corroded, shows in the DSC test ("Differential Scanning Calorimetry") a glass transition temperature of 264° C.

What is claimed is:

1. A method for bonding two objects, at least one of which being a polyimide film, said method comprising the steps of:
   (a) applying a thermally curable oxazene resin which contains at least one 1-oxa-3-aza tetraline group in the molecule as an adhesive to the surface of at least one of the objects;
   (b) contacting the two objects to be bonded together; and
   (c) thereafter thermally curing said oxazene resin.

2. A method according to claim 1, wherein said thermically curable oxazene resin contains more than one 1-oxa-3-aza tetraline group in the molecule.

3. A method according to claim 1, wherein said at least one 1-oxa-3-aza tetraline group of the oxazene resin is aromatically substituted on the nitrogen atom.

4. A method according to claim 1, wherein said at least one polyimide film is a polypyromellitimide film.

5. A method according to claim 1, wherein said polyimide film is bonded to a film of the same kind.

6. A method according to claim 1, wherein said polyimide film is bonded to another object.

7. A method according to claim 6, wherein said polyimide film is bonded to a metal.

8. A method according to claim 7, wherein said polyimide film is bonded to a sheet metal.

9. A method according to claim 7, wherein said polyimide film is bonded to a metal foil.

10. A method according to claim 9, wherein said polyimide film is bonded to a copper foil.

11. A method according to claim 9, wherein said polyimide film is bonded to an aluminium foil.

12. A method according to claim 9, wherein said polyimide film is bonded to a nickel foil.

13. A method according to claim 9, wherein said polyimide film is bonded to a resistance foil.

14. A method for bonding two objects, at least one of which being a polyimide film, said method comprising the steps of:
   (a) applying a mixture of a thermically curable oxazene resin which contains at least one 1-oxa-3-aza tetraline group in the molecule and of a curable epoxy resin as an adhesive to the surface of at least one of the objects;
   (b) contacting the two objects to be bonded together; and
   (c) thereafter thermically curing said resin mixture.

15. A method according to claim 14, wherein said thermically curable oxazene resin contains more than one 1-oxa-3-aza tetraline group in the molecule.

16. A method according to claim 14, wherein said at least one 1-oxa-3-aza tetraline group of said oxazene resin is aromatically substituted on the nitrogen atom.

17. A method according to claim 14, wherein said at least one polyimide film is a polypyromellitimide film.

18. A method according to claim 14, wherein said epoxy compound is cycloaliphatically substituted.

19. A method according to claim 18, wherein said epoxy compound contains at least two epoxy groups in the molecule, at least one of which being anellated in a cycloaliphatic ring, and the others being either also aromatically in such a ring or are directly linked to such a ring, the molar ratio of said epoxy groups to said 1-oxa-3-aza tetraline groups being from 0.2 to 2.

20. A method according to claim 19, wherein the molar ratio of said epoxy groups to said 1-oxa-3-aza tetraline groups is from 0.8 to 1.5.

21. A method according to claim 14, wherein the equivalent weight of said epoxy compound is from 70 to 250.

22. A method according to claim 21, wherein the equivalent weight of said epoxy compound is from 120 to 200.

23. A method according claim 14, wherein said epoxy compound is selected from the group consisting of:
   2-(3,4-epoxy)cyclohexyl-5,5-spiro(3,4-epoxy)-cyclohexane m-dioxane;
   onefold to fourfold methylated 2-(3,4-epoxy)cyclohexyl-5,5-spiro(3,4-epoxy)-cyclohexane m-dioxane;
   4-(1,2-epoxyethyl) 1,2-epoxycyclohexane;
   1,2:8,9-diepoxy p-menthane;
   2,2-bis(3,4-epoxycyclohexyl) propane;
   bis(2,3-epoxycyclopentyl) ether;
   1,2:5,6-diepoxy-4,7-hexahydromethano indane;
   bis(3,4-epoxycyclohexylmethyl) adipate;
   bis(3,4-epoxy-6-methyl-cyclohexylmethyl) adipate;
   bis(3,4-epoxycyclohexylmethyl) terephthalate;
   bis(3,4-epoxy-6-methyl-cyclohexylmethyl) terephthalate;
   3,4-epoxy-cyclohexane carboxylic acid-(3,4-epoxycyclohexylmethyl) ester;
   3,4-epoxy-6-methyl-cyclohexane carboxylic acid-(3,4-epoxy-6-methyl-cyclohexylmethyl) ester;
   1,2-bis(5(1,2-epoxy)-4,7-hexahydromethanoindanoxy) ethane;
   1,1,1-tris((5-(1,2-epoxy)-4,7-hexahydromethanoindanoxy)methyl) propane; and
   4,5-epoxy-hexahydrophthalic acid bis-(3,4-epoxycyclohexylmethyl).

24. A method according to claim 14, wherein said epoxy compound is of the formula $$X-Y,$$

wherein:
   X is a 3,4-epoxycyclohexyl group or a onefold or twofold methylated 3,4-epoxycyclohexyl group;
   Y is a group of the formula

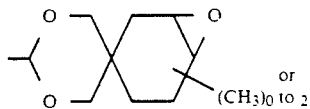

an epoxyethyl group of the formula

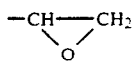

a group of the formula

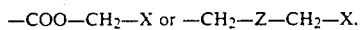

wherein Z is the acid residue of an aliphatic, cycloaliphatic or aromatic dicarboxylic acid.

25. A method according to claim 14, wherein said polyimide film is bonded to a film of the same kind.

26. A method according to claim 14, wherein said polyimide film is bonded to another substrate.

27. A method according to claim 26, wherein said polyimide film is bonded to a metal.

28. A method according to claim 27, wherein said polyimide film is bonded to a sheet metal.

29. A method according to claim 27, wherein said polyimide film is bonded to a metal foil.

30. A method according to claim 29, wherein said polyimide film is bonded to a copper foil.

31. A method according to claim 29, wherein said polyimide film is bonded to an aluminium foil.

32. A method according to claim 29, wherein said polyimide film is bonded to a nickel foil.

33. A method according to claim 29, wherein said polyimide film is bonded to a resistance foil.

34. A printed circuit board consisting of a polyimide carrier film and of a metal foil, said metal foil being bonded to said carrier film by means of a cured oxazene resin.

35. A printed circuit board consisting of a polyimide carrier film and of a metal foil, said metal foil being bonded to said carrier film by means of an oxazene resin cured in combination with at least one epoxy compound.

* * * * *